(12) United States Patent
Chang et al.

(10) Patent No.: US 10,141,906 B1
(45) Date of Patent: *Nov. 27, 2018

(54) HIGH Q QUARTZ-BASED MEMS RESONATORS AND METHOD OF FABRICATING SAME

(71) Applicant: HRL LABORATORIES LLC, Malibu, CA (US)

(72) Inventors: David T. Chang, Calabasas, CA (US); Frederic P. Stratton, Beverly Hills, CA (US); Hung Nguyen, Los Angeles, CA (US); Randall L. Kubena, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/149,026

(22) Filed: May 6, 2016

Related U.S. Application Data

(63) Continuation-in-part of application No. 14/286,419, filed on May 23, 2014, which is a continuation-in-part
(Continued)

(51) Int. Cl.
*H03H 3/02* (2006.01)
*H03H 9/19* (2006.01)
(Continued)

(52) U.S. Cl.
CPC ............ *H03H 3/02* (2013.01); *H03H 3/0072* (2013.01); *H03H 9/19* (2013.01); *H03H 2003/027* (2013.01); *H03H 2009/155* (2013.01)

(58) Field of Classification Search
None
See application file for complete search history.

(56) References Cited

U.S. PATENT DOCUMENTS

| 5,261,277 | A | | 11/1993 | Thomas et al. |
| 5,747,857 | A | * | 5/1998 | Eda .......................... H01L 27/20 257/416 |

(Continued)

OTHER PUBLICATIONS

From U.S. Appl. No. 12/816,292(now U.S. Pat. No. 8,765,615), Non-Final Office Action dated Aug. 9, 2012.
(Continued)

*Primary Examiner* — Shamim Ahmed
*Assistant Examiner* — Bradford M Gates
(74) *Attorney, Agent, or Firm* — Ladas & Parry

(57) ABSTRACT

A method of fabricating a resonator includes providing a first quartz substrate, forming a metallic etch stop on a first surface of the first quartz substrate; attaching, using a temporary adhesive, the first surface of the first quartz substrate to a second quartz substrate, etching an opening for a via in a second surface of the first quartz substrate to the metallic etch stop, forming a metal electrode on the second surface of the first quartz substrate, the metal electrode penetrating the via in the first quartz substrate to make ohmic contact with the metallic etch stop, bonding the metal electrode formed on the second surface of the first quartz substrate to a pad formed on a host substrate; and dissolving the temporary adhesive to release the second quartz substrate from the first quartz substrate, wherein the first quartz substrate and the host substrate each comprise crystalline quartz.

21 Claims, 14 Drawing Sheets

Related U.S. Application Data of application No. 12/816,292, filed on Jun. 15, 2010, now Pat. No. 8,765,615.

(60) Provisional application No. 62/190,419, filed on Jul. 9, 2015.

(51) Int. Cl.
*H03H 3/007* (2006.01)
*H03H 9/15* (2006.01)

(56) References Cited

U.S. PATENT DOCUMENTS

| | | | |
|---|---|---|---|
| 7,237,315 | B2 | 7/2007 | Kubena et al. |
| 7,647,688 | B1 | 1/2010 | Chang et al. |
| 8,567,041 | B1 | 10/2013 | Roper |
| 8,765,615 | B1 | 7/2014 | Chang et al. |
| 2004/0132310 | A1 | 7/2004 | Nakatani et al. |
| 2005/0231078 | A1 | 10/2005 | Tanaka |
| 2007/0017287 | A1 | 1/2007 | Kubena et al. |
| 2007/0086502 | A1 | 4/2007 | Burns |
| 2008/0036335 | A1 | 2/2008 | Naito et al. |
| 2008/0073318 | A1 | 3/2008 | Saito |
| 2008/0258829 | A1 | 10/2008 | Kubena et al. |
| 2010/0117489 | A1* | 5/2010 | Takahashi ............ H03H 9/0595 310/344 |

OTHER PUBLICATIONS

From U.S. Appl. No. 12/816,292(now U.S. Pat. No. 8,765,615), Final Office Action dated Dec. 14, 2012.
U.S. Appl. No. 14/286,419, filed May 23, 2014, Chang et al.
From U.S. Appl. No. 12/816,292(now U.S. Pat. No. 8,765,615), Non-Final Office Action dated Oct. 18, 2013.
From U.S. Appl. No. 12/816,292(now U.S. Pat. No. 8,765,615), Notice of Allowance dated Feb. 24, 2014.
From U.S. Appl. No. 14/286,419(currently unpublished), Non-Final Office Action dated Sep. 9, 2016.
From U.S. Appl. No. 14/286,419 (Unpublished; non publication requested) Non-Final Office Action dated Oct. 17, 2017.

\* cited by examiner

HIGH Q QUARTZ-BASED MEMS RESONATORS AND METHOD OF FABRICATING SAME

CROSS-REFERENCE TO RELATED APPLICATIONS

This is a continuation-in-part of U.S. patent application Ser. No. 14/286,419, titled "High Q Quartz-Based MEMS Resonators and Method of Fabricating Same," filed May 23, 2014, which is a continuation-in-part of U.S. patent application Ser. No. 12/816,292, titled "Quartz-Based MEMS Resonators and Method of Fabricating Same," filed Jun. 15, 2010 and which has issued as U.S. Pat. No. 8,765,615, each of which is incorporated herein by reference. This application is related to and claims the benefit of priority of U.S. Provisional Patent Application No. 62/190,419, titled "High Q Quartz-Based MEMS Resonators and Method of Fabricating Same", filed Jul. 9, 2015, and U.S. patent application Ser. No. 14/286,419, titled "High Q Quartz-Based MEMS Resonators and Method of Fabricating Same," filed May 23, 2014, each of which is incorporated herein by reference.

STATEMENT REGARDING FEDERALLY SPONSORED RESEARCH OR DEVELOPMENT

This invention was made with Government support. The Goverment has certain rights in the invention.

STATEMENT REGARDING FEDERAL FUNDING

None

BACKGROUND

Field

The present technology relates to thickness-shear mode quartz resonators, and more specifically, it relates to high Q quartz-based MEMS resonators operating at HF-UHF band.

Description of Related Art

A process for manufacturing a quartz-based nanoresonator was provided in U.S. Pat. No. 7,237,315, titled "Method for Fabricating a Resonator," incorporated herein by reference. U.S. Pat. No. 7,237,315 addresses VHF to UHF frequency devices that have less than 10 µm of quartz thickness. FIGS. 1-12 briefly illustrate the prior art sequence of process steps described in the incorporated patent. As shown in FIG. 1, the starting materials include a single-crystal quartz wafer 10, a silicon handle wafer 12 and a host substrate 14. The process begins by defining and etching cavities in a silicon handle wafer. FIG. 2 shows a single cavity 16 etched into silicon handle wafer 12. It is to be understood that batch processing is accomplished by carrying out the processes described herein at a plurality of sites on a wafer. Then, metal (e.g., Al or Au) is deposited onto single-crystal quartz wafer 10 to form top-side electrodes 18 and tuning pad 20, as shown in FIG. 3. Next, the two wafers 10 and 12 are brought together using a direct bonding process, as shown in FIG. 4. After a low temperature bonding/annealing step, a combination of processes including wafer grinding/lapping, chemical-mechanical-planarization (CMP), plasma etching and chemical polishing is used to thin the quartz down to a thickness, typically less than 10 microns, for a desired resonant frequency.

FIG. 5 shows the quartz wafer 10 after it has been thinned. Referring to FIG. 6, photolithography is used to pattern contact via holes 22 in the quartz layer 10. The holes are etched through quartz to stop on the top-side electrode metal and then metalized to form the through-wafer vias. FIG. 6 shows metal 24 in vias 22. FIG. 7 shows the bottom-side electrodes 26 that have been formed by metallization. As shown in FIG. 8, the quartz layer 10 has been patterned and etched to form the resonator 11. FIG. 8 shows a single resonator, but through batch processing, many resonators can be produced simultaneously. FIG. 9 shows a protrusion 28 that remains after material has been etched from the host substrate 14. Metallization patterns 30, including bonding pads, are defined on the substrate 14 as shown in FIG. 10. As illustrated in FIG. 11, the quartz wafer 10/silicon handle 12 pair is bonded to the host wafer 14 using either a Au—Au or Au—In compression bonding scheme. The silicon handle wafer is removed with a combination of dry and wet etches, resulting in the quartz resonator 11 being attached only to the host wafer 14, as shown in FIG. 12. Note that U.S. Pat. No. 7,237,315 uses spin coating of a soft mask (photoresist) for patterning the metal, quartz and silicon structures. Unfortunately, the soft mask cannot be used to form lower frequency devices.

What is needed are resonators covering the frequency range of the prior art and that are able to operate at a much lower HF range. The embodiments of the present disclosure answer these and other needs.

SUMMARY

High-yield fabrication methods are provided for making quartz resonators having thicknesses ranging from one micrometer to several hundred micrometers and thus covering the frequency range from HF to UHF. The present disclosure describes techniques for wafer- or chip-scale integration of quartz resonators with or without electronics to form oscillator circuits. Presently, commercial quartz crystal resonators are fabricated as separate off-chip, discrete components and later added to oscillator application specific integrated circuits (ASICs) in most electronic devices requiring precision timing standards. Thus, the size and cost of the overall unit are significantly increased. U.S. Pat. No. 7,237,315 titled "Method for Fabricating a Resonator," incorporated herein by reference, describes fabrication methods to perform on-chip integration of miniaturized quartz resonators that operate at VHF and UHF frequencies. The present disclosure describes thick quartz resonators and methods for making same for frequency operation at or below the VHF frequency band. The resonant frequency of a thickness-shear mode quartz resonator is inversely proportional to the quartz layer thickness.

Future development of electronics requiring low-cost, highly integrated precision timing standards can be realized as a result of the present disclosure. Examples of applications of quartz oscillators include GPS receivers, atomic clocks, radios and phase-lock loop electronics. These examples cover virtually all hand-held wireless electronics. Cell phones and MP3 players are ubiquitous devices that are potential large-volume commercial insertion points for this technology.

The present disclosure describes a thickness-shear mode quartz resonator design that is suitable for making oscillators with frequencies ranging from HF (3 to 30 MHz) to UHF band (300 MHz to 3 GHz). The fabrication method includes a step of temporary attachment of the quartz device wafer to a quartz handle wafer using adhesive bonding for plasma dry etching. High-Q operation with energy trapping/mode confinement with mesa structures is enabled by plasma dry etching. Batch etching of resonators on a single quartz substrate can yield hundreds of devices per wafer. The via and resonator are concurrently formed in a single plasma dry etch step. Solvent dissolution of an adhesive layer releases and transfers the resonators to a host substrate. If the substrate is an ASIC, direct wafer scale integration of quartz resonators with the drive circuitry forms a fully integrated monolithic crystal oscillator and a hermetically sealed package to provide stable operation.

Both U.S. Pat. No. 7,237,315 and the present disclosure use similar MEMS fabrication technology to form the resonator structure. However, due to the vastly different quartz thickness between the UHF and lower frequency devices (several microns compared with several tens or hundreds of microns), the soft (photoresist) mask used in U.S. Pat. No. 7,237,315 cannot be applied to the present disclosure. The present disclosure also introduces a novel quartz resonator temporary attachment and release technology that can increase device yield and lower cost.

In a first embodiment disclosed herein a method of fabricating a resonator comprises providing a first quartz substrate, forming a metallic etch stop on a portion of a first surface of the first quartz substrate, attaching, using a temporary adhesive, the first surface of the first quartz substrate and the metallic etch stop formed thereon to a second quartz substrate, applying a dry etch mask on a second surface of the first quartz substrate, the dry etch mask including a first opening, etching through the first opening to thereby etch a via through the first quartz substrate to the metallic etch stop, forming a metal electrode on the second surface of the first quartz substrate, the metal electrode penetrating the via in the first quartz substrate to make ohmic contact with the metallic etch stop, bonding the metal electrode formed on the second surface of the first quartz substrate to a pad formed on a host substrate, and dissolving the temporary adhesive to release the second quartz substrate from the first surface of the first quartz substrate and the metallic etch stop, wherein the first quartz substrate and the host substrate each comprise crystalline quartz.

In another embodiment disclosed herein an apparatus comprises a host substrate comprising a first bond pad and a second bond pad, a quartz resonator comprising a first quartz substrate having a first side and a second side opposite the first side, a via, a first electrode, a second electrode and a third electrode, wherein the first electrode is on the first side and overlaps the via, wherein the second electrode is on the second side, extends into the via and is in electrical contact with the first electrode, wherein the second electrode is in electrical contact with the first bond pad, and wherein the third electrode is on the second side and is in electrical contact with the second bond pad, and a first mesa located on the first side and a second mesa located on said second side, wherein the first quartz substrate and the host substrate each comprise crystalline quartz.

BRIEF DESCRIPTION OF THE DRAWINGS

The accompanying drawings, which are incorporated into and form a part of the present disclosure, illustrate embodiments of the invention and, together with the description, serve to explain various principles of the invention.

DETAILED DESCRIPTION

Figure 1:
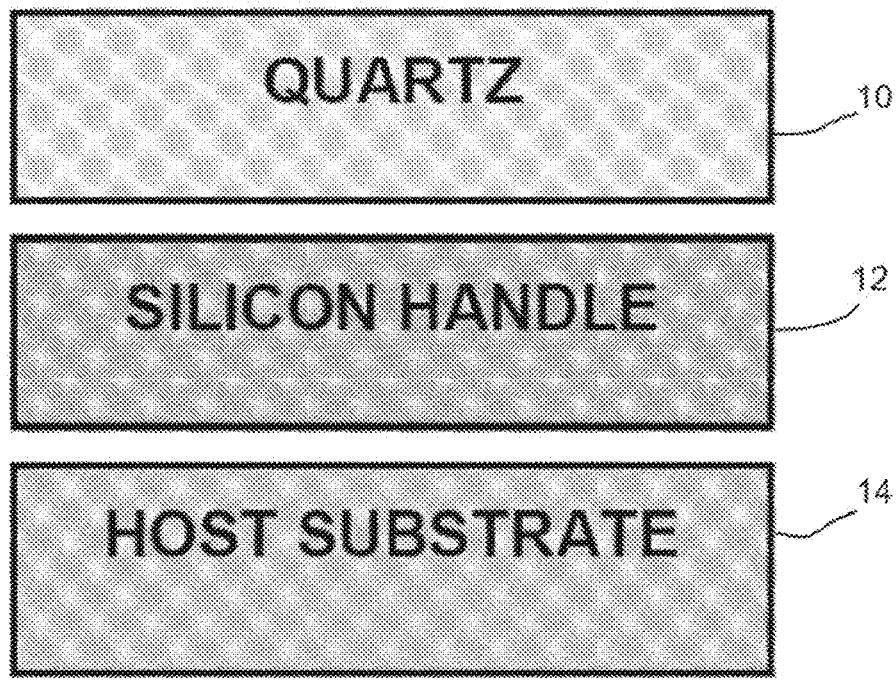
FIG. 1 (prior art) shows the starting materials including a single-crystal quartz wafer, a silicon handle wafer and a host substrate.
Figure 2:
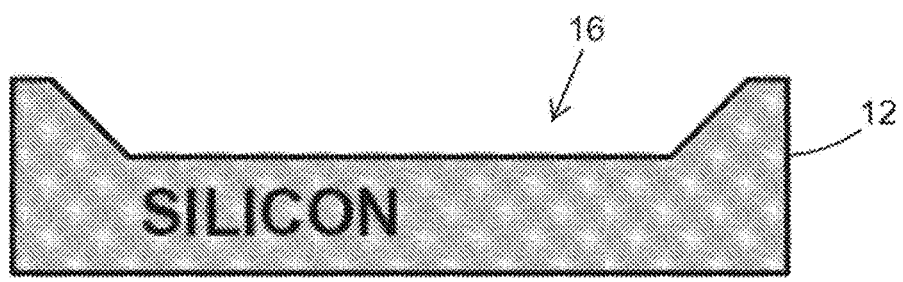
FIG. 2 (prior art) shows a single cavity etched into silicon handle wafer.
Figure 3:
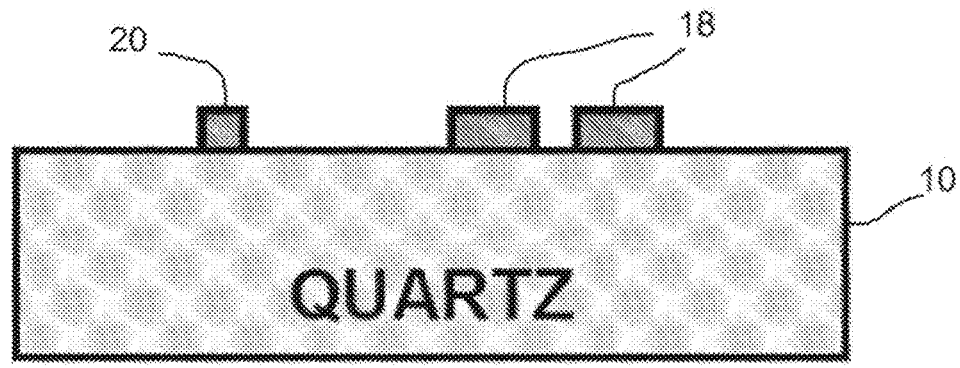
FIG. 3 (prior art) shows metal deposited onto the single-crystal quartz wafer to form top-side electrodes and a tuning pad.
Figure 4:
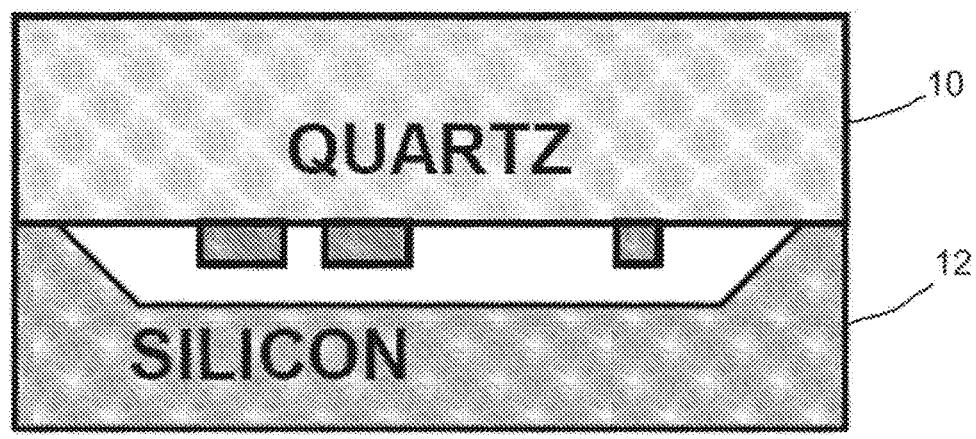
FIG. 4 (prior art) shows the quartz and silicon wafers bonded together.
Figure 5:
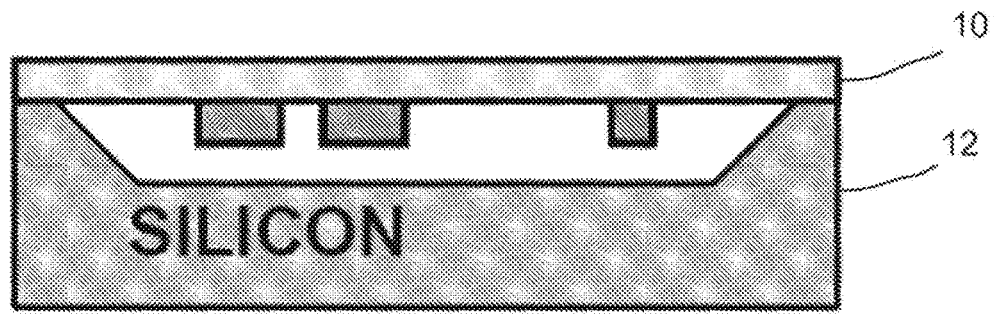
FIG. 5 (prior art) shows the quartz wafer after it has been thinned.
Figure 6:
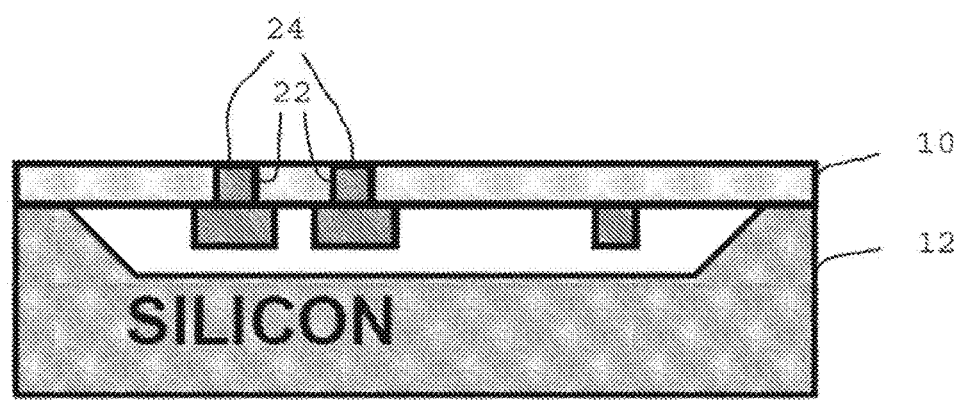
FIG. 6 (prior art) illustrates via holes that have been photolithographically created in the quartz layer.
Figure 7:
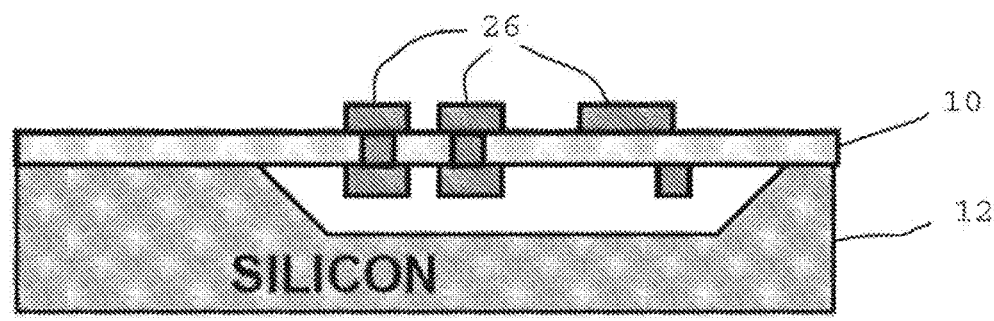
FIG. 7 (prior art) shows the bottom-side electrodes that have been formed by metallization.
Figure 8:
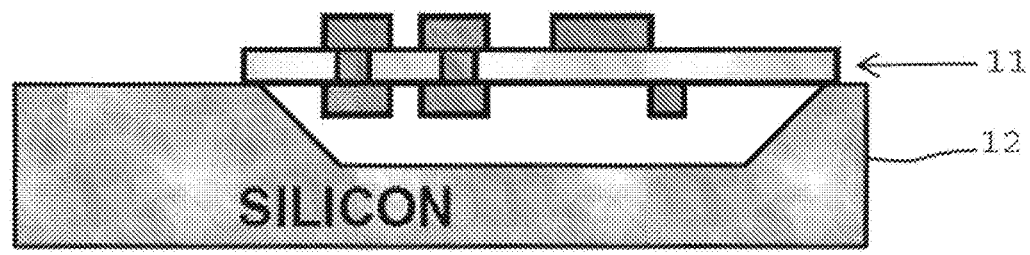
FIG. 8 (prior art) shows the quartz layer 10 patterned and etched to form the resonator.
Figure 9:
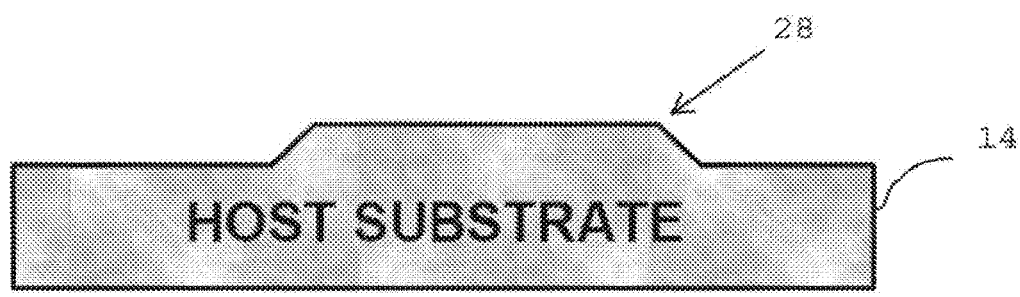
FIG. 9 (prior art) shows a protrusion etched from the host substrate.
Figure 10:
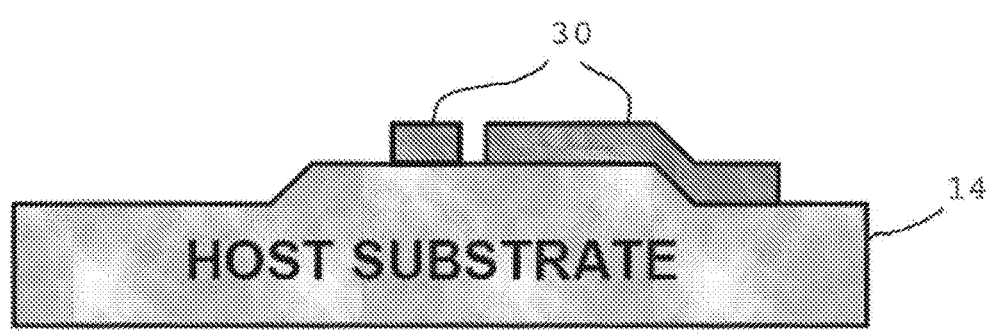
FIG. 10 (prior art) illustrates metallization patterns defined on the host substrate.
Figure 11:
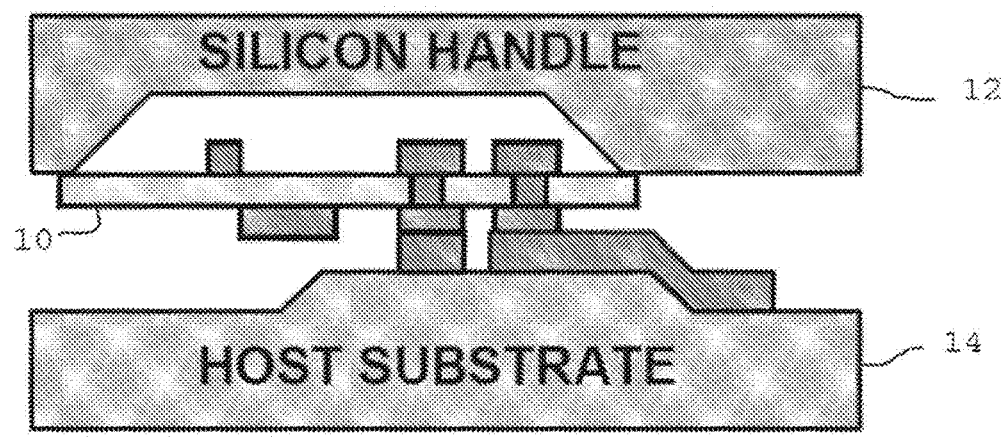
FIG. 11 (prior art) shows the quartz wafer/silicon handle pair bonded to the host wafer.
Figure 12:
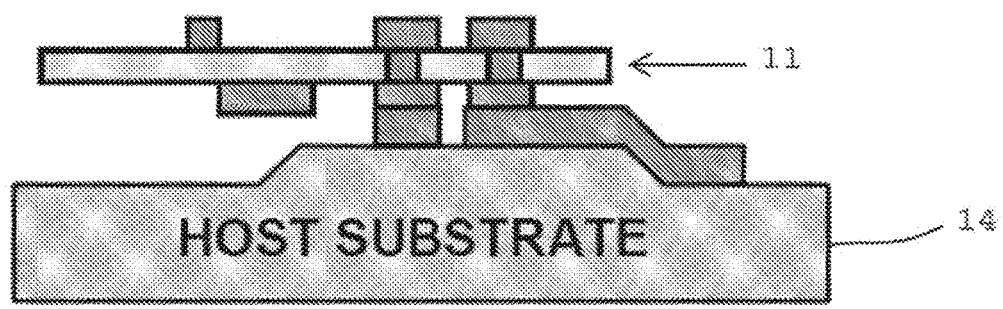
FIG. 12 (prior art) shows the quartz resonator being attached only to the host wafer after the silicon handle wafer has been removed.
Figure 13:
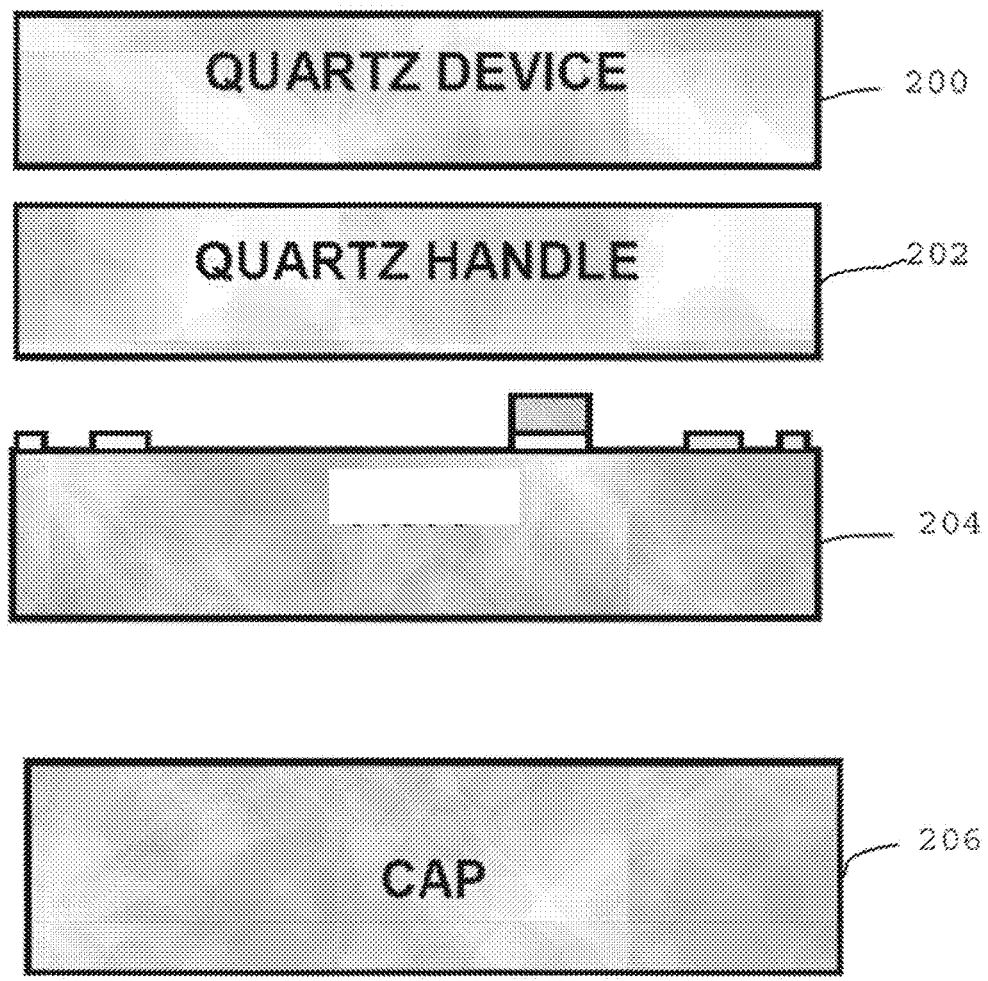
FIG. 13 shows starting materials of the process of some embodiments of the present disclosure as illustrated in FIGS. 13-31, wherein the starting materials include a quartz device wafer, a quartz handle wafer, a host substrate and a cap wafer.

An exemplary fabrication process flow for an integrated quartz oscillator is illustrated in cross-section in FIGS. 13-31. The starting materials, as shown in a side view in FIG. 13, consist of a quartz device wafer 200 (for the resonator), a handle wafer 202, a host substrate 204 (which could be a silicon wafer and/or a quartz wafer with or without oscillator drive circuitry) and a cap wafer 206 (e.g., a silicon cap or a quartz cap) for hermetic sealing purpose. A quartz handle wafer is chosen instead of a silicon handle because the quartz handle offers better thermal matching to the quartz device wafer. The host substrate design provided herein is exemplary only and other configurations are within the scope of the present disclosure. In an embodiment, the handle wafer is made of quartz. In general, it is desirable that the handle wafer is formed of materials that have a coefficient of thermal expansion within a range from 0.5 to 12 ppm/degree C. Exemplary materials include crystalline quartz, fused quartz (amorphous), silicon, gallium arsenide, indium phosphide and sapphire.

Figure 14:
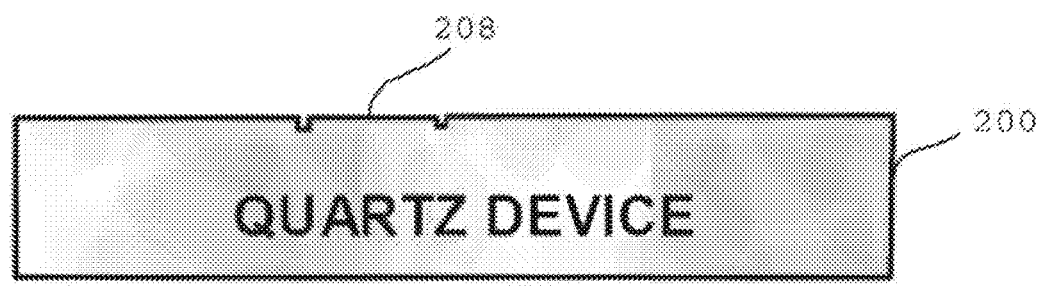
FIG. 14 shows a first step in this exemplary embodiment where a mesa has been etched in to the quartz device.
Figure 20:
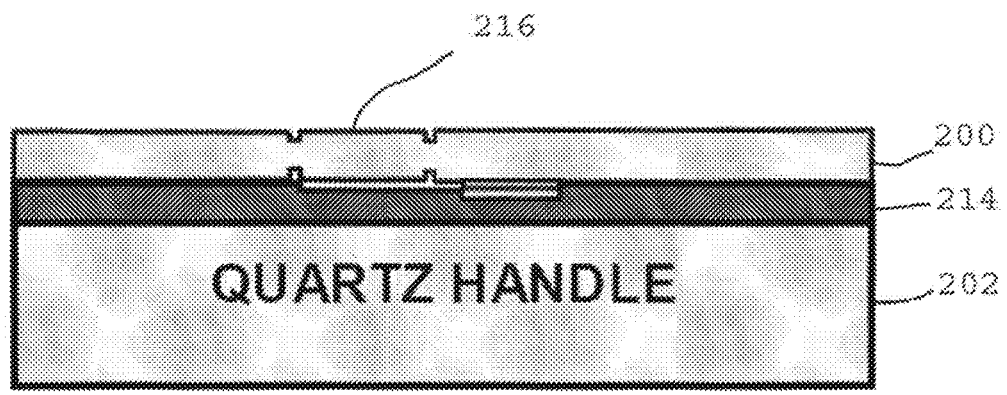
FIG. 20 shows a second mesa structure on the bottom side of the quartz device wafer.
Figure 27:
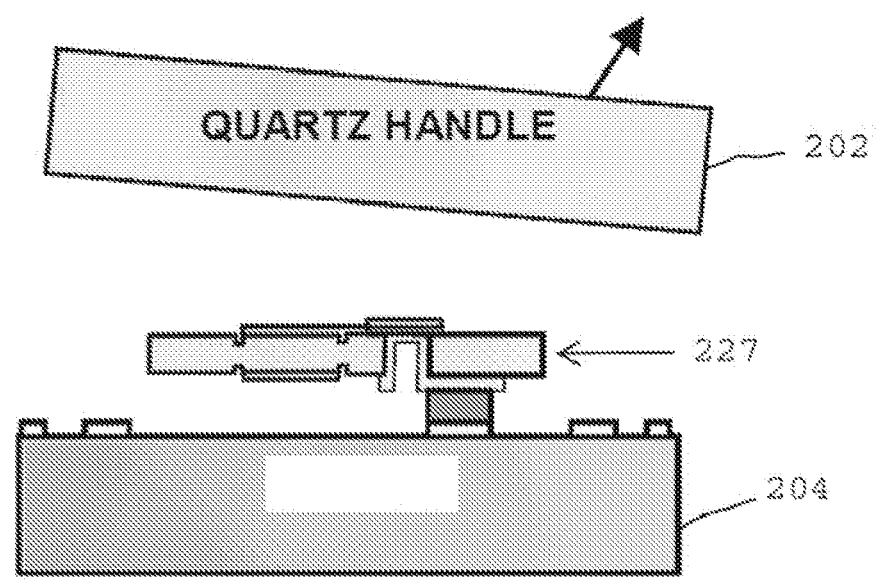
FIG. 27 shows the resonators released from the handle wafer.

Referring to FIG. 14, an embodiment of the process begins with plasma dry etching of quartz to form a mesa 208 on the top side of the quartz device wafer 200. Techniques for plasma dry etching are known in the art. The mesa serves as an energy confinement structure to mitigate dissipation of shear mode energy outside the active area (to be deposited with metal electrodes). The use of the mesa will result in an increase in the quality-factor of the device. The mesa configuration shown in FIG. 14 is merely an example. Other mesa configurations can be used and are within the scope of the present disclosure. In other embodiments, the mesa can have a different geometry or may be completely omitted. In this embodiment, a matching mesa is formed on the opposite side of the quartz device, as shown in FIG. 20. For most embodiments, the specific geometry of the mesa structure formed on one side of the quartz device is matched on the opposite side. In this embodiment, FIG. 27 shows a particular quartz resonator 227 that includes the mesa structure as formed in FIGS. 14 and 20. It will be appreciated by those skilled in the art that the final resonator structure formed according to some embodiments of the present disclosure will include a specific mesa structure if one is formed into the structure during the fabrication process. The quality factor or Q factor is a dimensionless parameter that describes how under-damped an oscillator or resonator is, or equivalently, characterizes a resonator's bandwidth relative to its center frequency. Higher Q indicates a lower rate of energy loss relative to the stored energy of the resonator; the oscillations die out more slowly. Resonators with high quality factors have low damping so that they ring longer.

Figure 15:
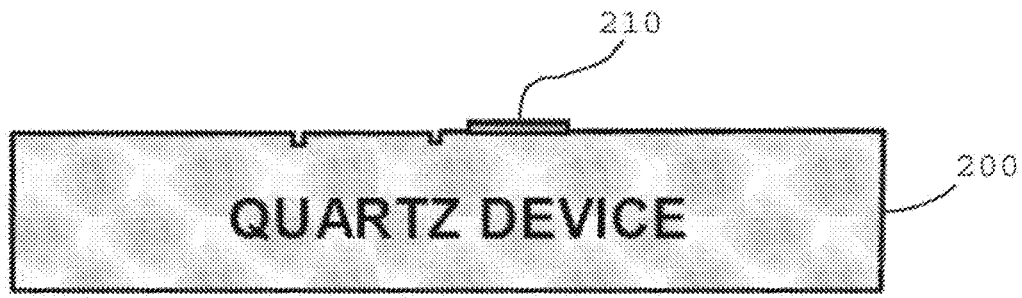
FIG. 15 shows a top-side metallization on the quartz device wafer to form an etch stop layer for the subsequent via etch.

As shown in FIG. 15, the fabrication continues with a top-side metallization on the quartz device wafer 200 to form an etch stop layer for the subsequent via etch. Metallization techniques are known in the art. The metal pad 210 consists of Cr, Ni and Au. Those skilled in the art will understand that other materials can be used for the metal pad.

Figure 16:
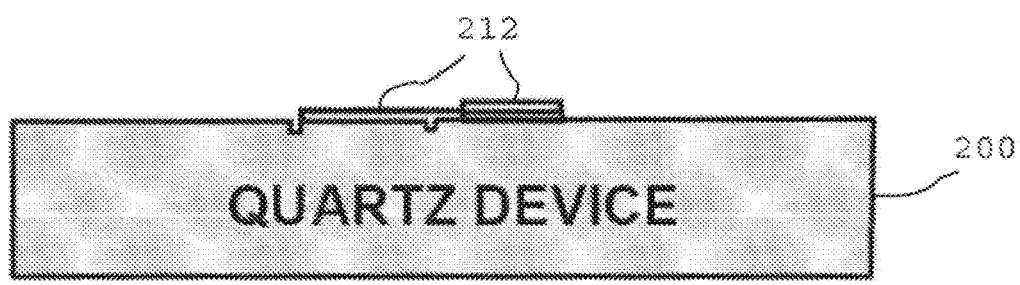
FIG. 16 shows a metal stack deposited to form the top side electrode.
Figure 17:
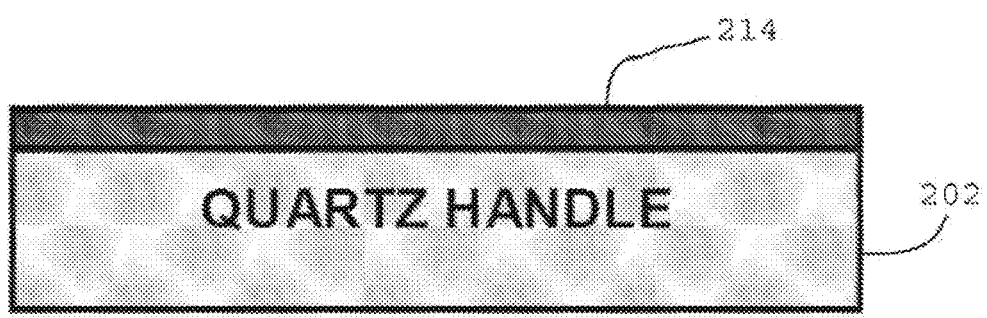
FIG. 17 shows an adhesive coated onto the handle wafer.

Referring to FIG. 16, another metal stack (e.g., Cr/Au) is deposited onto quartz device wafer 200 to form the top side electrode 212. FIG. 17 shows an adhesive 214 coated onto the handle wafer 202. Techniques for coating adhesive materials are known in the art. Exemplary materials used for the adhesive include a petroleum-based wax or a high temperature epoxy.

Figure 18:
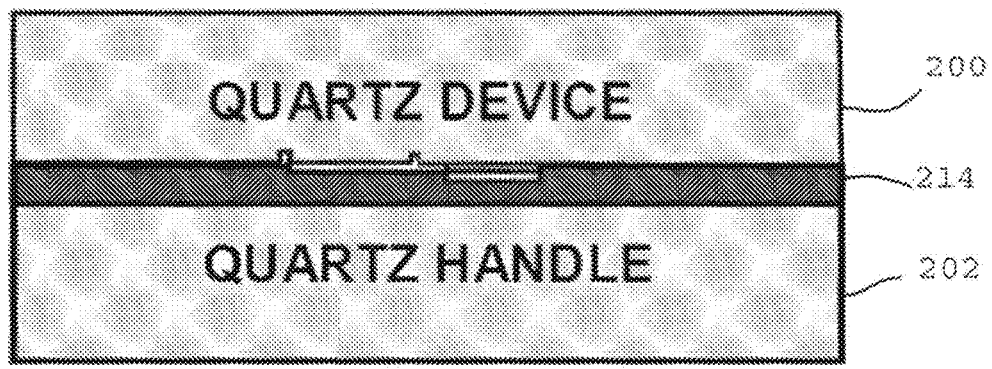
FIG. 18 shows the quartz device wafer flipped upside down and bonded to the handle.

As shown in FIG. 18, the quartz device wafer is then flipped upside down and bonded to the handle using a thermo-compression bond. Techniques for manipulating the wafers are known in the art.

Figure 19:
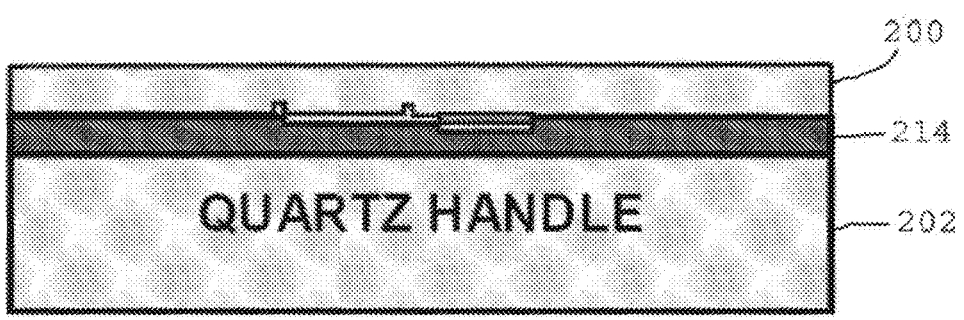
FIG. 19 shows the quartz device wafer thinned to a desired thickness.

The quartz device wafer 200 is subsequently thinned, as shown in FIG. 19, to a desired thickness to reflect the operating frequency using both wafer grinding and chemical mechanical planarization (CMP). Thinning techniques are known in the art. An exemplary thinning process is explained in detail in the incorporated patent.

Referring to FIG. 20, another plasma etch is performed to create the matching mesa structure 216 on the bottom side of the quartz device wafer 200 for energy confinement purpose.

Figure 21:
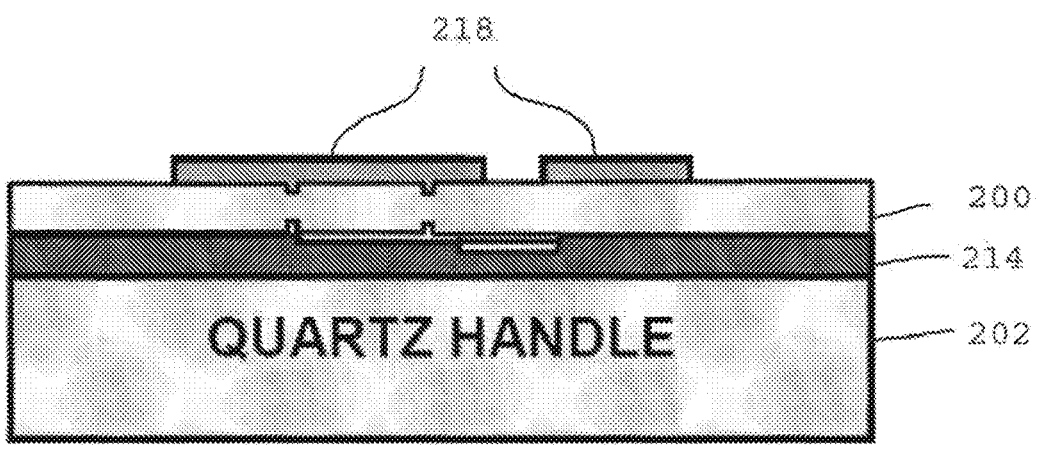
FIG. 21 shows a dry etch mask that has been deposited onto the quartz device wafer.
Figure 22:
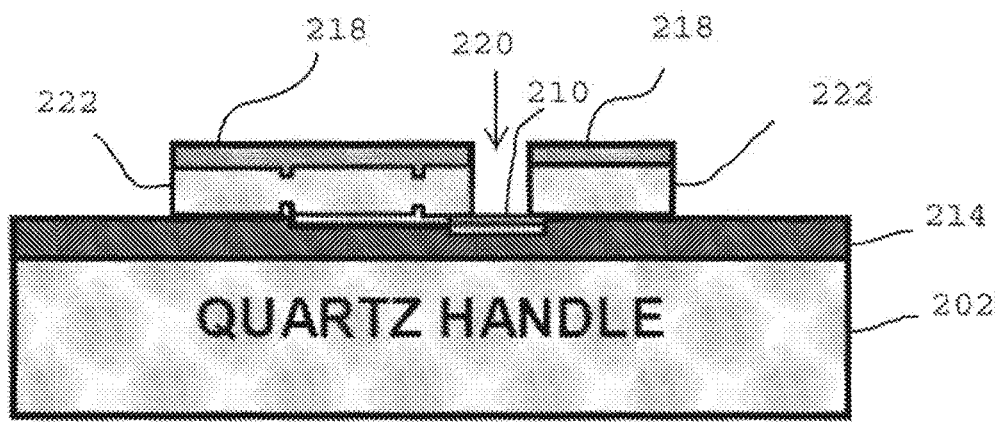
FIG. 22 shows the via and resonator sidewalls after an etching process has been carried out.
Figure 23:
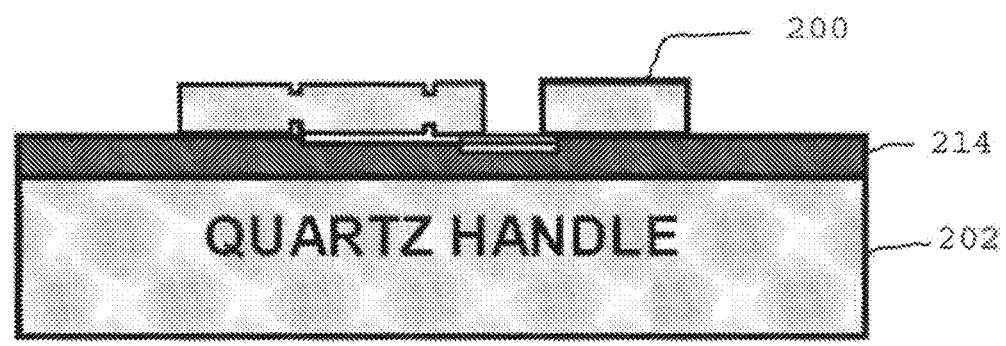
FIG. 23 shows the exposed quartz device wafer after the dry etch mask has been removed.
Figure 24:
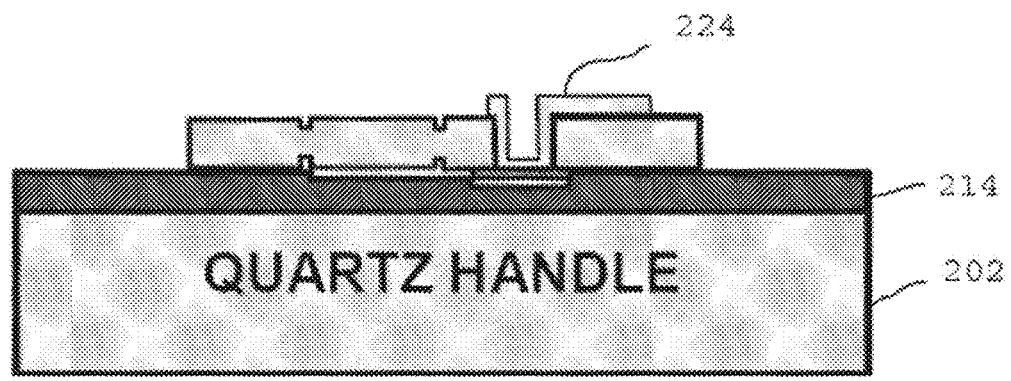
FIG. 24 shows a layer of Cr/Au conformally deposited and etched to form the resonator bond pads and via metal to connect to the top electrode.
Figure 25:
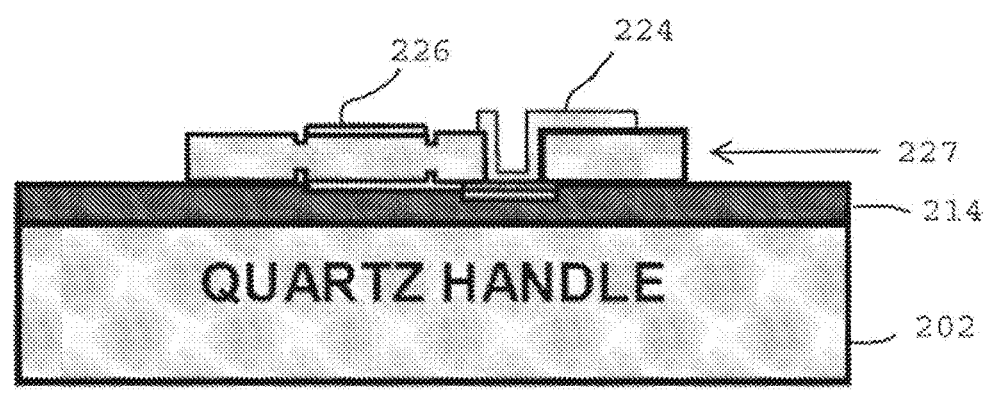
FIG. 25 shows another Cr/Au layer that has been deposited and patterned to form the bottom electrode of the quartz resonator.
Figure 26:
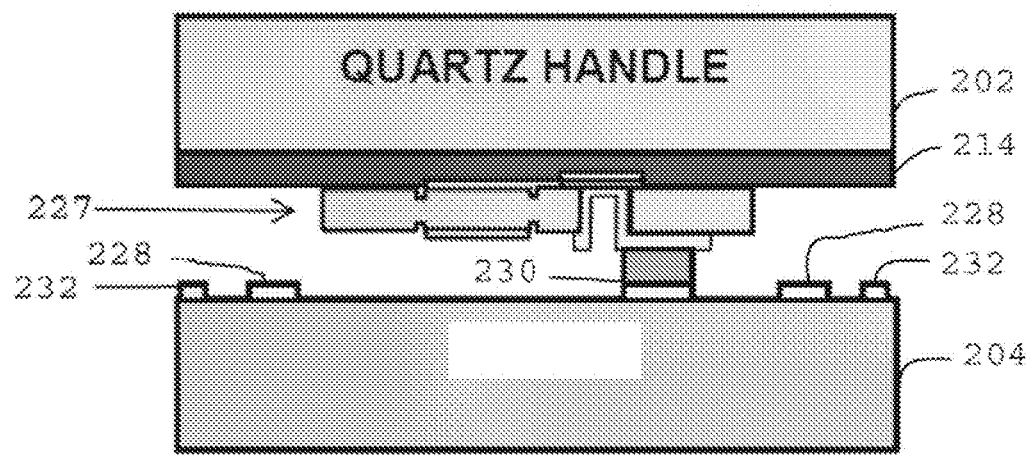
FIG. 26 shows the host wafer, where the pin-out probe pads, substrate bond pads and capping seal rings have been deposited.

As shown in FIG. 21, a dry etch mask 218 is then deposited onto quartz device wafer 200 to carry out a combined via and resonator plasma dry etch. The dry etch mask 218 can be formed of Al or Ni and is patterned on the bottom side of the quartz resonator to form the via and resonator openings. Note that FIG. 21 is a cross-sectional representation. A top view would reveal that the opening for the via is within the boundaries of a single portion of the dry etch mask 218. For example, a single circular opening in the dry etch mask could be provided to allow the via to be etched. The opening could take other shapes as well. Referring to FIG. 22, a fluorine-based plasma is then used to etch the via 220 and resonator sidewalls 222. The quartz device wafer is then singulated into individual resonator bodies. As discussed above, the via would be an opening in the resonator body. The sidewalls of the resonator body can be vertical or angled. The Cr/Ni/Au etch stop layer (210 as also shown in FIG. 15) on the top side of the quartz device wafer will prevent the plasma from puncturing the top side electrode. As shown in FIG. 23, the Al or Ni dry etch mask 218 of FIGS. 21 and 22 has been stripped, leaving the quartz device wafer 200 exposed. FIG. 24 shows a layer 224 of Cr/Au conformally deposited and etched to form the resonator bond pads and via metal to connect to the top electrode. FIG. 25 shows another Cr/Au layer 226 that has been deposited and patterned to form the bottom electrode of the quartz resonator 227. FIG. 26 shows the host wafer 204, where pin-out probe pads 232, substrate bond pads 230 and capping seal rings 228 have been deposited with metal (e.g., Cr/Pt/Au or Cr/Pt/Au/In). Exemplary materials for use in the substrate bond pad include Au and Au/In. The quartz resonator can be joined to the substrate wafer 204 with compression bonding. Note that the substrate bond pad 230 is electrically connected to layer 224. Not shown in FIG. 26 is that layer 226 is connected to a separate bond pad. Thus, bond pad 230 is electrically connected to layer 224, which is connected to metallic etch stop 210 which is connected to electrode 212. Electrode 226 across the resonator body 227 from electrode 212, which is electrically connected to another bond pad on the substrate. Thus, a voltage may be applied across the resonator body between electrode 226 and 212 to cause the resonator to vibrate. The quartz device/handle wafer pair is then aligned and bonded to the host substrate wafer 204 with a metal-metal thermo-compression or a conductive adhesive bond using a commercial wafer bonder. The bonded stack can be soaked in an appropriate solvent to dissolve the adhesive, thus freeing the resonators 227 from the handle wafer 202 and leaving them on the host substrate wafer 204, as shown in FIG. 27. Again, the mesa structure shown in FIG. 27 is only provided as an example. It is within the scope and teachings of the present disclosure to provide a resonator that does not include a mesa structure. Various embodiments of the present disclosure contemplate the use of alternate mesa structures as well. Further, the particular form of the resonator as shown in FIG. 27 is provided as an example. Those skilled in the art will recognize that other resonator designs can be produced according to the teachings herein. The fully released devices are then baked in a vacuum oven to completely rid themselves of any residual solvent.

Figure 28:
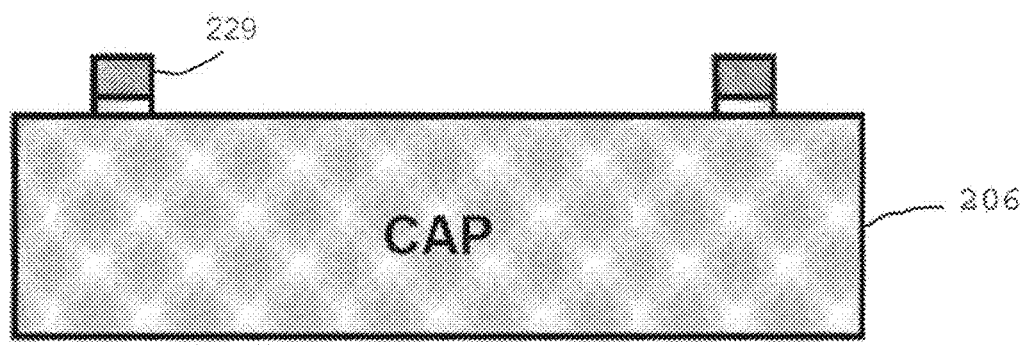
FIG. 28 shows the cap wafer with a metal stack deposited to form the seal ring for hermetical sealing of the quartz resonator.
Figure 29:
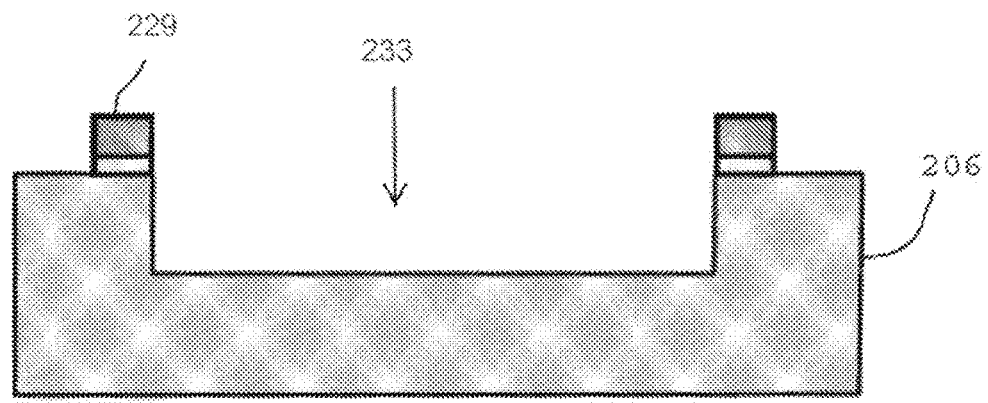
FIG. 29 shows a cavity formed in the cap layer to accommodate the quartz resonator on the host substrate wafer.

Referring to FIG. 28, a metal stack 229 (e.g., Ti/Ni/Au/Sn) is deposited on the cap wafer 206 to form the seal ring for hermetical sealing of the quartz resonator. FIGS. 28-31 show the seal ring and cap wafer in cross-section. Referring to FIG. 29, a recess etch is performed to create a cavity 233 to accommodate the quartz resonator on the host substrate.

Figure 30:
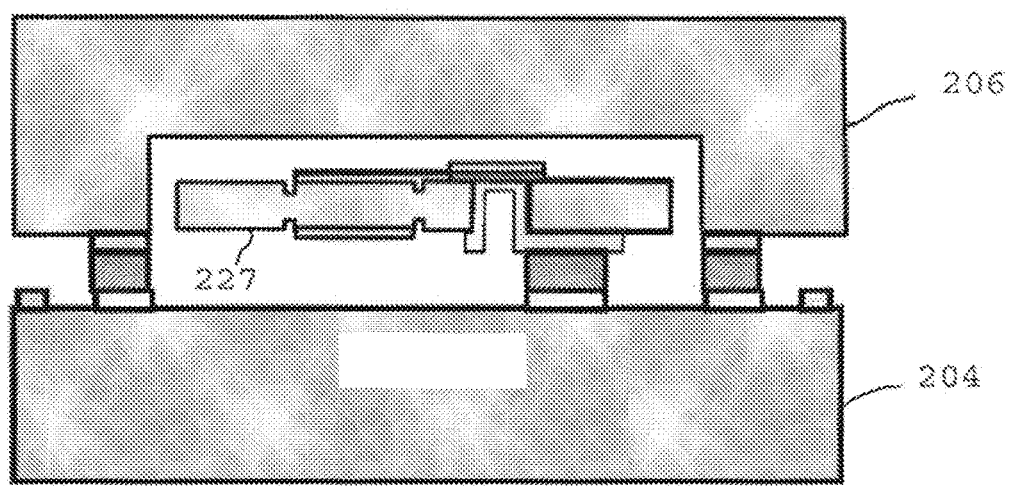
FIG. 30 shows the cap bonded to the quartz resonator/oscillator wafer.
Figure 31:
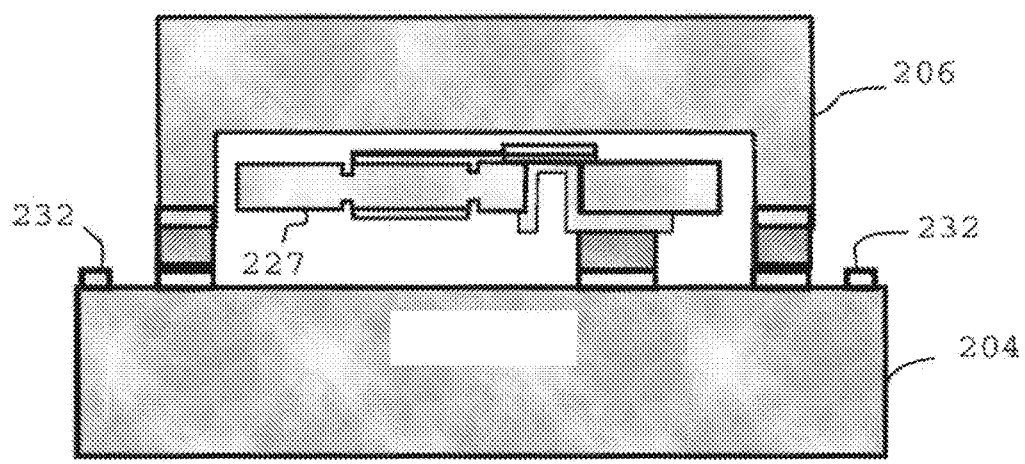
FIG. 31 shows the cap wafer after it has been etched for access to the pin-out pads.

Using a wafer bonder, the cap 206 is bonded to the quartz resonator/oscillator wafer 204, as shown in FIG. 30. FIG. 31 shows the cap wafer 206 after it has been etched for access to the pin-out pads 232. FIG. 31 shows the cap wafer 206 and the substrate wafer 204 in cross section. The resonator 227 is fully enclosed within the boundaries of the cap wafer 206 and the substrate wafer 204.

The substrate wafer 204 can be composed of various materials such as Si, fused quartz, crystalline quartz, III-V semiconductors, or other composite materials such as Si—Ge. If the substrate is a semiconductor, then electronics can be added to the substrate prior to bonding to allow full wafer-level integration of the sustaining circuit with the quartz resonator for an oscillator. However, since the thermal expansion coefficient of semiconductor substrates can differ from that of crystalline quartz, stress propagation from the mounting pads can affect the stability of the resonator over temperature (e.g., across a range of temperatures).

To remove this temperature sensitivity of the resonator, a crystalline quartz substrate of the same orientation as the resonator can be used. The quartz resonator and the quartz substrate are thereby perfectly matched for low stress and hysteresis over temperature. However, in this case, the sustaining circuit may need to be located adjacent to the resonator substrate.

In some embodiments, the quartz substrate does not have the same orientation as the resonator. Also, in various embodiments, the sustaining circuit could be disposed in a variety of positions relative to the resonator substrate, including embedded in, coupled to, disposed on, or positioned over the resonator substrate. Embedding may be easier when using materials other than quartz such as Si, SiGe, Si carbide, etc.

If a Si substrate is utilized, a Si capping wafer (e.g., cap wafer 206) could be used, again so that stress is minimized over temperature. If a quartz substrate is utilized, then a crystalline quartz cap wafer could be used of the same orientation for a common cap and substrate. In general, one wants to use a cap and substrate made of materials with very similar thermal expansion coefficients to minimize packaging stress over temperature.

Broadly, the present disclosure provides a method for batch processing of miniaturized thickness-shear mode quartz resonators that operate at frequencies ranging from HF (3-30 MHz) to UHF (300 MHz-3 GHz). Quartz resonators are formed by bonding a quartz device wafer to a quartz handle wafer. This may be done with a temporary adhesive, which may be a petroleum-based wax. Plasma dry etching is utilized to form arbitrary resonator geometries. The quartz resonator structure and the through-quartz vias are concurrently formed. Thermo-compression or conductive adhesive bonding is used to integrate quartz resonators to a host wafer (e.g., an oscillator ASIC) to form oscillators. Mesa structures formed, e.g., by plasma etching, enable resonators capable of high-Q operation with energy trapping/mode confinement by utilizing mesa structures formed by plasma dry etching. Wafer scale hermetic encapsulation of the quartz oscillators is achieved by bonding of cap wafers in a vacuum.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of fabricating a resonator comprising:
   providing a first quartz substrate;
   forming a metallic etch stop on a portion of a first surface of the first quartz substrate;
   attaching, using a temporary adhesive, the first surface of the first quartz substrate and the metallic etch stop formed thereon to a second quartz substrate;
   applying a dry etch mask on a second surface of the first quartz substrate, the dry etch mask including a first opening;
   etching, using a dry etchant, through the first opening to thereby etch a via through the first quartz substrate to the metallic etch stop;
   forming a metal electrode on the second surface of the first quartz substrate, the metal electrode penetrating the via in the first quartz substrate to make ohmic contact with the metallic etch stop;
bonding the metal electrode formed on the second surface of the first quartz substrate to a pad formed on a host substrate, wherein the first quartz substrate is not in direct contact with the host substrate;
dissolving the temporary adhesive to release the second quartz substrate from the first surface of the first quartz substrate and the metallic etch stop; and
attaching a cap to the host substrate;
wherein the first quartz substrate comprises crystalline quartz which has a first orientation of the crystalline quartz;
wherein the second quartz substrate comprises crystalline quartz which has a second orientation which is the same as the first orientation;
wherein the host substrate comprises crystalline quartz which has a third orientation which is the same as the first orientation;
wherein the cap comprises crystalline quartz which has a fourth orientation which is the same as the first orientation;
wherein the first quartz substrate and the second quartz substrate when attached are aligned so that the first orientation of the first quartz substrate is aligned with the second orientation of the second quartz substrate; and
wherein the first quartz substrate, the host substrate and the cap when attached are aligned so that the first orientation of the first quartz substrate is aligned with the third orientation of the host substrate and aligned with the fourth orientation of the cap.

2. The method of claim 1 wherein the cap comprises a cavity, wherein the cavity is facing the host substrate such that a chamber is produced, wherein the first quartz substrate is enclosed within the chamber.

3. The method of claim 1:
wherein the metallic etch stop forms an electrode on the first surface of the first quartz substrate; and
wherein the electrode comprises layers of Cr and Au with the Cr layer is disposed closer to the first quartz substrate.

4. The method of claim 1 wherein the step of directing a dry etchant further comprises defining a perimeter shape of the first quartz substrate.

5. The method of claim 4, wherein the dry etchant comprises a fluorine-based plasma.

6. The method of claim 1:
wherein a plurality of resonators are formed simultaneously from a single first quartz substrate, the first quartz substrate having a plurality of metallic etch stops, each the etch stop being each formed on a portion of the first surface of the first quartz substrate, the portion aligning with each one of the resonators for each one of the metallic etch stops.

7. The method of claim 1:
wherein a second metallic electrode is formed on a second surface of the first quartz substrate opposing the metallic etch stop formed on the first surface of the first quartz substrate, the second metallic electrode and the first mentioned metallic electrode being electrically isolated and physically spaced from each other.

8. The method of claim 1:
wherein prior to the step of forming a metallic etch stop, the method further comprises etching a first mesa on the first surface of the first quartz substrate.

9. The method of claim 8:
wherein prior to the step of dry etching a via through the first quartz substrate to the etch stop, the method further comprises etching a second mesa in the second surface of the first quartz substrate; and
wherein the first mesa is directly across the quartz wafer from the second mesa.

10. The method of claim 1 wherein the etch stop comprises layers of Cr and Au with the Cr layer disposed closer to the first quartz substrate.

11. The method of claim 2:
wherein the host substrate comprises a capping seal ring comprising a first metal stack selected from the group consisting of Cr/Pt/Au and Cr/Pt/Au/In; and
wherein the cap comprises a second metal stack comprising Cr/Pt/Au/In, wherein the first metal stack is bonded to the second metal stack.

12. An apparatus, comprising:
a host substrate comprising a first bond pad and a second bond pad;
a quartz resonator comprising a first quartz substrate having a first side and a second side opposite the first side, a via, a first electrode, a second electrode and a third electrode, wherein the first electrode is on the first side and electrically connected to the via, wherein the second electrode is on the second side and is in electrical contact with the via and the first electrode, wherein the second electrode is in physical and electrical contact with the first bond pad, and wherein the third electrode is on the second side and is in physical and electrical contact with the second bond pad;
a first mesa located on the first side and a second mesa located on said second side; and
a cap attached to the host substrate;
wherein the first quartz substrate is not in direct contact with the host substrate;
wherein the first quartz substrate comprises crystalline quartz which has a first orientation of the crystalline quartz;
wherein the host substrate comprises crystalline quartz which has a second orientation which is the same as the first orientation;
wherein the cap comprises crystalline quartz which has a third orientation which is the same as the first orientation; and
wherein the first quartz substrate, the host substrate and the cap are aligned so that the first orientation of the first quartz substrate is aligned with the second orientation of the host substrate and aligned with the third orientation of the cap.

13. The apparatus of claim 12 wherein the cap comprises a cavity, wherein the cavity is facing the host substrate such that the quartz resonator is enclosed within the chamber.

14. The apparatus of claim 13, wherein said wafer includes a capping seal ring comprising a first metal stack selected from the group consisting of Cr/Pt/Au and Cr/Pt/Au/In, wherein said cap comprises a second metal stack comprising Cr/Pt/Au/In, wherein said first metal stack is bonded to said second metal stack.

15. An apparatus, comprising:
a quartz resonator body comprising a first side, a second side and a via;
a quartz application-specific integrated circuit (ASIC) wafer comprising an electrically conductive first bond pad and an electrically conductive second bond pad;
a quartz cap;
a first mesa defined by a first groove in said first side;

a second mesa defined by a second groove in said second side;
a first electrode overlapping said via and filling a portion of said first groove on said first side;
a contiguous metal portion on said second side and extending into said via such that said contiguous metal portion makes electrical contact with said first electrode;
a second electrode on said second side, wherein said contiguous metal portion is connected to said first electrically conductive bond pad and wherein said second electrode is connected to said second electrically conductive bond pad; and
wherein said quartz ASIC includes a capping seal ring comprising a first metal stack selected from the group consisting of Cr/Pt/Au and Cr/Pt/Au/In, wherein said quartz cap comprises a second metal stack comprising Cr/Pt/Au/In, wherein said first metal stack is bonded to said second metal stack.

16. A method of fabricating a resonator, comprising:
providing a quartz application-specific integrated circuit (ASIC) wafer comprising a first bond pad and a second bond pad;
providing a quartz resonator comprising a first side, a second side opposite said first side, a via, a first electrode, a second electrode and a third electrode, wherein said first electrode is on said first side and overlaps said via, wherein said second electrode is on said second side, extends into said via and is in electrical contact with said first electrode, wherein said second electrode is in electrical contact with said first bond pad, and wherein said third electrode is on said second side and is in electrical contact with said second bond pad, wherein said via is formed by a dry etching process; and
providing a first mesa located on said first side, said first mesa being defined by forming a first groove into said first side so that said first mesa is at least partially surrounded by material having the same thickness relative to said first groove as said first mesa but positioned laterally of said first mesa and separated therefrom by said first groove;
providing a second mesa located on said second side, said second mesa being defined by forming a second groove into said second side so that said second mesa is at least partially surrounded by material having the same thickness relative to said second groove as said second mesa but positioned laterally of said second mesa and separated therefrom by said first groove, the first and second groves increasing the quality factor (Q) of the resonator being fabricated; and
providing a first electrode on said first mesa and providing a second electrode on said second mesa, the first electrode filling a portion of said first groove.

17. The method of claim 16, further comprising:
attaching a quartz cap to said ASIC, wherein said quartz cap comprises a cavity, wherein said cavity is facing said ASIC such that a chamber is produced,
wherein said quartz resonator is enclosed within said chamber.

18. The method of claim 17, wherein said ASIC includes a capping seal ring comprising a first metal stack selected from the group consisting of Cr/Pt/Au and Cr/Pt/Au/In, wherein said quartz cap comprises a second metal stack comprising Cr/Pt/Au/In, wherein said first metal stack is bonded to said second metal stack.

19. A method of fabricating a resonator comprising:
providing a first quartz substrate;
forming a metallic etch stop on a portion of a first major surface of the first quartz substrate;
adhesively attaching, using a temporary adhesive, the first major surface of the first quartz substrate and the metallic etch stop formed thereon to a second quartz substrate, the temporary adhesive having a thickness sufficient to accommodate a thickness of said metallic etch stop;
applying an etch mask on a second major surface of said first quartz substrate, said etch mask including a first opening;
etching through said first opening to thereby etch a via through said first quartz substrate to said metallic etch stop and etching the first substrate to define the bar of the vibrating bar resonator from said first quartz substrate;
forming a metal electrode on a second major surface of the first quartz substrate, the metal electrode penetrating the via in the first quartz substrate to make ohmic contact with the metallic etch stop;
bonding the metal electrode formed on the second major surface of the first quartz substrate to a pad formed on a substrate bearing oscillator drive circuitry to form a bond there between; and
dissolving the temporary adhesive to thereby release the second quartz substrate from the substrate bearing oscillator drive circuitry and a portion of the first quartz substrate bonded thereto via the bond formed between the metal electrode formed on the second major surface of the first quartz substrate to and the pad formed on the substrate bearing oscillator drive circuitry.

20. A method of fabricating a resonator comprising:
providing a first quartz substrate;
providing a second quartz substrate;
providing a host quartz substrate;
providing a quartz cap;
attaching, using a temporary adhesive, a first surface of the first quartz substrate to the second quartz substrate;
forming a metal electrode on a second surface of the first quartz substrate, the metal electrode;
bonding the metal electrode formed on the second surface of the first quartz substrate to a pad formed on the host substrate,
dissolving the temporary adhesive to release the second quartz substrate from the first surface of the first quartz substrate; and
attaching a cap to the host substrate;
wherein the first quartz substrate comprises crystalline quartz which has a first orientation of the crystalline quartz;
wherein the second quartz substrate comprises crystalline quartz which has a second orientation which is the same as the first orientation;
wherein the host substrate comprises crystalline quartz which has a third orientation which is the same as the first orientation;
wherein the cap comprises crystalline quartz which has a fourth orientation which is the same as the first orientation;
wherein the first quartz substrate and the second quartz substrate when attached are aligned so that the first orientation of the first quartz substrate is aligned with the second orientation of the second quartz substrate; and wherein the first quartz substrate, the host substrate and the cap when attached are aligned so that the first orientation of the first quartz substrate is aligned with the third orientation of the host substrate and aligned with the fourth orientation of the cap.

21. An apparatus, comprising:

a host substrate comprising a first bond pad;

a quartz resonator comprising a first quartz substrate and a first electrode on the first quartz substrate in physical and electrical contact with the first bond pad;

a cap attached to the host substrate;

wherein the first quartz substrate comprises crystalline quartz which has a first orientation of the crystalline quartz;

wherein the host substrate comprises crystalline quartz which has a second orientation which is the same as the first orientation;

wherein the cap comprises crystalline quartz which has a third orientation which is the same as the first orientation; and wherein the first quartz substrate, the host substrate and the cap are aligned so that the first orientation of the first quartz substrate is aligned with the second orientation of the host substrate and aligned with the third orientation of the cap.

* * * * *